United States Patent [19]

Miyazaki et al.

[11] Patent Number: 4,561,169
[45] Date of Patent: Dec. 31, 1985

[54] METHOD OF MANUFACTURING SEMICONDUCTOR DEVICE UTILIZING MULTILAYER MASK

[75] Inventors: Masaru Miyazaki, Ohme; Susumu Takahashi, Nishitama; Takahiro Kohashi, Tsukui; Kiichi Ueyanagi, Kokubunji, all of Japan

[73] Assignee: Hitachi, Ltd., Tokyo, Japan

[21] Appl. No.: 517,409

[22] Filed: Jul. 26, 1983

[30] Foreign Application Priority Data

Jul. 30, 1982 [JP] Japan .................................. 57-131929
Aug. 30, 1982 [JP] Japan .................................. 57-149225

[51] Int. Cl.$^4$ ............................................. H01L 21/441
[52] U.S. Cl. ......................................... 29/571; 29/578; 29/579; 29/591
[58] Field of Search .................... 29/571, 576 B, 578, 29/579, 591; 148/1.5

[56] References Cited

U.S. PATENT DOCUMENTS 3,994,758 11/1976 Ogawa et al. ..................... 29/579 X
4,182,023 1/1980 Cohen et al. ..................... 29/579 X
4,213,840 7/1980 Omori et al. ..................... 29/579 X

FOREIGN PATENT DOCUMENTS 0057558 8/1982 European Pat. Off. .

Primary Examiner—Brian E. Hearn
Assistant Examiner—Alan E. Schiavelli
Attorney, Agent, or Firm—Antonelli, Terry & Wands

[57] ABSTRACT

In manufacturing a field effect transistor, a pattern which has a wider upper layer and a narrower lower layer is formed at a gate electrode position. Using the pattern as a mask, first and second impurity regions are formed on both the sides of a gate region by ion implantation. Subsequently, at least the lower layer is buried in a material, such as an organic high polymer material, having a selectivity in etching characteristics with respect to the pattern material. After removing the lower layer, an electrode material is embedded in the resulting hole so as to form a gate electrode.

36 Claims, 31 Drawing Figures

4,561,169

METHOD OF MANUFACTURING SEMICONDUCTOR DEVICE UTILIZING MULTILAYER MASK

BACKGROUND OF THE INVENTION

This invention relates to a method of manufacturing a semiconductor device such as a GaAs-FET (field effect transistor).

In order to enhance the performances of a GaAs-FET (field effect transistor) and an IC (integrated circuit), fabrication technology for submicron regions is needed. To this end, fine processing techniques based on the electron-beam lithography have been studied. In the current situation, however, there is the disadvantage that the through-put cannot be raised. Although it has been attempted to enhance the processing accuracy by resorting to the conventional photolithography and utilizing self-alignment, the prior-art methods have the disadvantages of inferior tolerance of heating and small processing margin.

FIG. 1 is a sectional view showing the fundamental setup of a GaAs-FET. Referring to the figure, numeral 1 designates a GaAs substrate, numeral 2 a source region, numeral 3 a drain region, numeral 4 a gate region which is formed between the source region 2 and the drain region 3, numerals 5, 6 and 7 a source electrode, drain electrode and gate electrode, respectively, and numeral 8 a protective film.

In such GaAs-FET, it is necessary for enhancing the performance of the device to narrow the interval between the source region 2 and the drain region 3 to the utmost. In addition, the gate electrode 7 must be fined so as to reduce the capacitance of the gate electrode 7. With the fabrication technology based on the conventional photolithography, the wavelength limitation of light makes it impossible to fabricate patterns of or below 1 $\mu$m reliably and difficult to attain a superposition accuracy within $\pm 1$ $\mu$m, so that a satisfactory performance cannot be achieved.

Examples of such GaAs-FET are found in ISSCC Dig. of Tech. Papers, p. 218 (1981) by N. Yokoyama et al, etc.

SUMMARY OF THE INVENTION

An object of the present invention is to provide a method of manufacturing a semiconductor device which affords an excellent yield of production and which can demonstrate the characteristics of the semiconductor device satisfactorily.

In order to accomplish the object, according to this invention, first and second impurity regions are formed on both sides of a gate region by the use of a pattern consisting of a wider upper layer and a narrower lower layer; at least the lower layer is buried in a material, such as organic high polymer, having a selectivity in etching characteristics with respect to the material of the pattern; and after removing the lower layer, an electrode material is embedded in the resulting hole, thereby to form a gate electrode.

According to the present invention, the gate electrode can be formed in self-alignment to source and drain electrodes, and hence, the respective parts can have their dimensions reduced as compared with those fabricated by a conventional method, which brings forth the effect that FET characteristics can be enhanced. It is necessary for enhancing the performance to lower the series resistance between the source and drain and to lower the capacitance of the gate electrode. To this end, it is necessary in the manufacturing process to enhance the fabrication in the submicron order and the superposition accuracy. With the fabrication technology based on the conventional photolithography, only gate lengths above 1 $\mu$m can be realized, and the superposition accuracy is not very high.

The present invention provides the method of manufacturing a semiconductor device which, while using the conventional photolithography, enhances both the fabrication in the submicron order and the superposition accuracy owing to the self-alignment.

BRIEF DESCRIPTION OF THE DRAWINGS

The present invention will now be described in detail with reference to the drawings, in which.

DETAILED DESCRIPTION OF THE INVENTION

Figure 1:
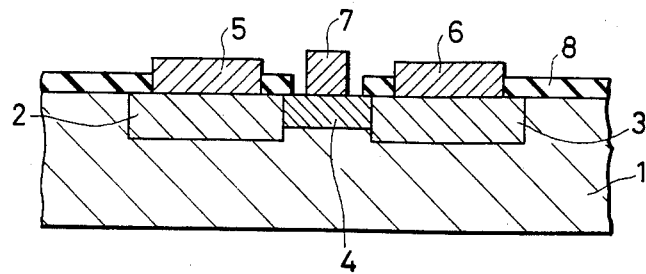
FIG. 1 is a sectional view showing the fundamental structure of a MES (Metal-Semiconductor) type FET.
Figure 2A:
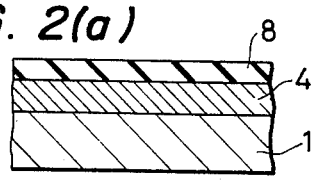
FIGS. 2($a$–$g$), 3($a$–$h$), 4($a$–$i$), 5($a,b$) and 6($a$–$d$) are sectional views each showing a process for manufacturing a semiconductor device according to the present invention.
Figure 2B:
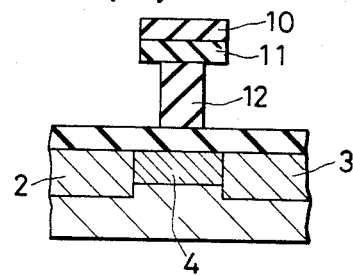
Figure 2C:
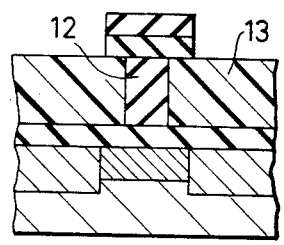
Figure 2D:
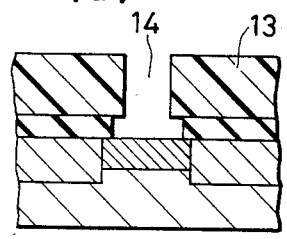
Figure 2E:
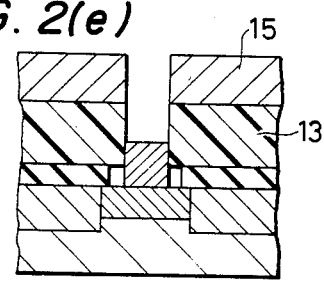
Figure 2F:
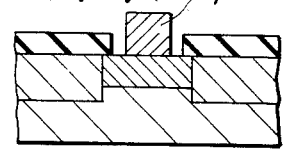
Figure 2G:
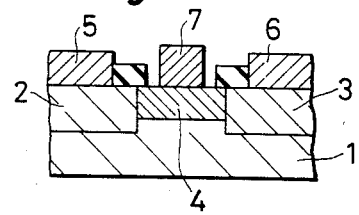
Figure 3A:
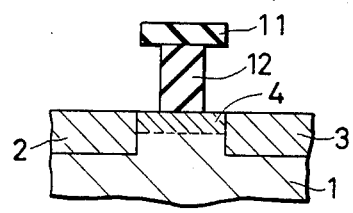
Figure 3B:
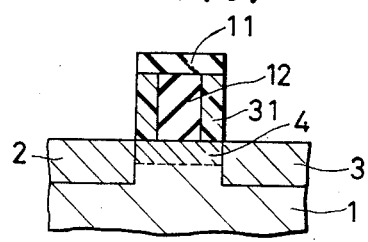
Figure 3C:
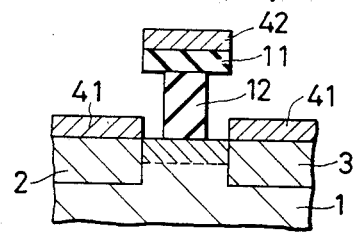
Figure 3D:
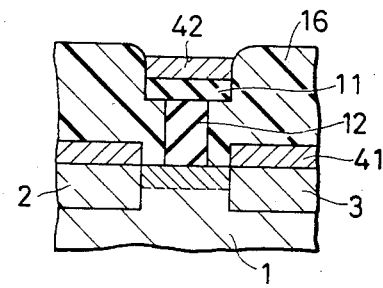
Figure 3E:
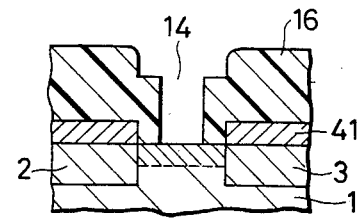
Figure 3F:
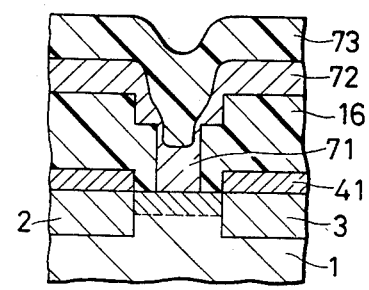
Figure 3G:
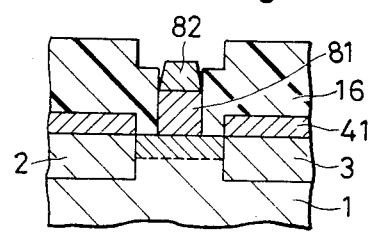
Figure 3H:
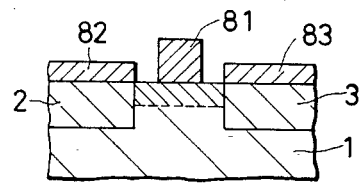
Figure 4A:
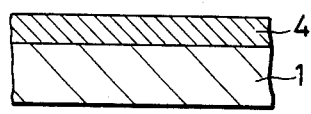
Figure 4B:
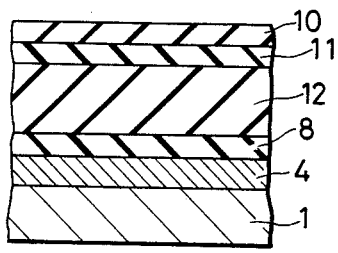
Figure 4C:
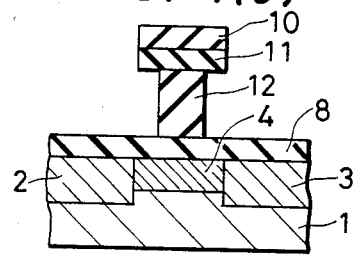
Figure 4D:
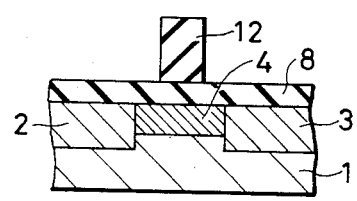
Figure 4E:
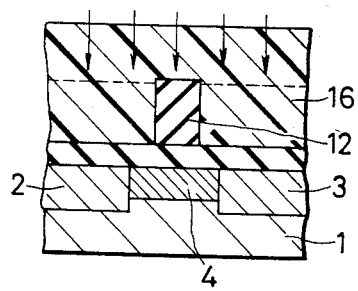
Figure 4F:
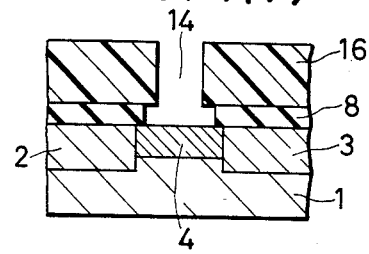
Figure 4G:
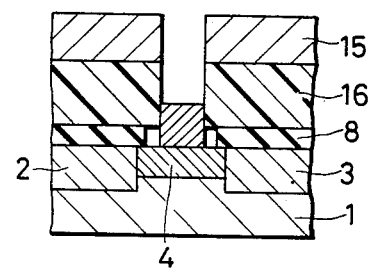
Figure 4H:
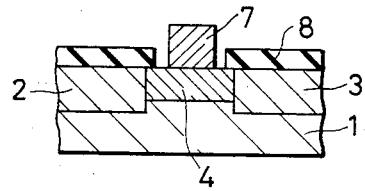
Figure 4I:
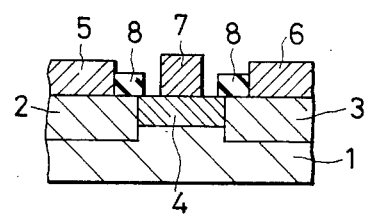

As basic steps, the present invention comprises the steps of forming a pattern at a gate electrode position on a predetermined semiconductor body, the pattern including at least two regions of an upper layer and a lower layer, the upper layer being wider than the lower layer; forming first and second impurity regions on both sides of a gate region by ion implantation by employing at least the pattern as a mask; forming a layer of a material on the substrate in a manner to bury at least the lower layer, the material having a selectivity in etching characteristics with respect to a material of the pattern; subsequently removing said pattern, and forming a reversal pattern of at least said lower layer; evaporating a metal layer for a gate electrode; removing the material layer having the selectivity in etching characteristics with respect to the pattern material; and forming respective electrodes in contact with said first and second impurity regions.

When, in the above method, the width of the lower layer is set at that of the gate electrode and the width of the upper layer is set at that of the gate region in advance, the widths of the gate electrode and the gate region are realized. The ion implantation is carried out through the upper layer (for example, 10 and 11 in FIG. 2), to form the first and second impurity regions (2 and 3 in FIG. 2) on both the sides of the gate region (4 in FIG. 2).

The lower layer (12 in FIG. 2) is buried in a material such as resin, and the material is subsequently removed, thereby to form the replica of the lower layer. The gate electrode is formed by utilizing the replica.

When, in this manner, mask registration is performed at the beginning in order to form the upper and lower layers, positions are automatically set in the later steps.

For the upper and lower layers, inorganic materials exhibiting selectivities in etching characteristics to each other are usually selected. The combinations of the upper and lower layers are, for example, poly-Si-SiO$_2$, SiO$_2$-silicon nitride, W-SiO$_2$, and Ti or Mo-PSG. Thus, the lower layer can be made of a non-conductive material. Proper thicknesses are 0.2–0.6 μm for the upper layer and 0.4–1.0 μm for the lower layer.

Although the upper layer and lower layer have been conceptually referred to, each of these layers may well be formed of a plurality of layers.

In forming on the substrate the material layer which has the selectivity in etching characteristics with respect to the pattern material, the upper layer may well be removed in advance. In this case, there is the advantage that the width of the lower layer can be acknowledged. Usable as the burying material are high polymers, for example, a rubber type resin, phenol resin, novolac resin, epoxy resin etc. Typically, photoresist material is usually used. The organic high polymers are mentioned above are the most favorable for affording the selectivity in etching characteristics with respect to the pattern material.

A protective film for the surface of the semiconductor substrate may be formed at the beginning of the manufacturing process, or can also be formed in the latter half of the process. This will be concretely described in the ensuing embodiments.

EMBODIMENT 1

This embodiment will be explained with reference to sectional views of FIG. 2 showing a manufacturing process.

Using a photoresist pattern as a mask, Si ions are implanted into the required part of a semi-insulating GaAs substrate 1, which is subsequently annealed, thereby to form an n-type active region 4. Next, an silicon nitride protective film 8 which is 50 nm thick is formed on the GaAs substrate (FIG. 2, (a)). Further, on the protective film 8, an SiO$_2$ film 12 being 800 nm thick and a poly-Si film 11 being 300 nm thick are stacked by well-known methods. A photoresist pattern 10 is formed on at least that part of the poly-Si film 11 which corresponds to a gate electrode position. Using the photoresist pattern 10 as a mask, the poly-Si film 11 and the SiO$_2$ film 12 are etched. In this case, the poly-Si film 11 is etched by a dry etching method employing as a carrier gas a gaseous mixture consisting of CF$_4$ and oxygen, while the SiO$_2$ film 12 is etched by a dry etching method employing CCl$_2$F$_2$ as a carrier gas. Thus, the lower layer 12 and the upper layer 11 are so etched that the former has a width smaller than the pattern width of the latter (FIG. 2, (b)).

Subsequently, the GaAs substrate thus prepared is implanted with Si ions at a high density and then annealed at 850° C. so as to form n+ region (2, 3). The n+ regions 2 and 3 are a source region and a drain region formed on both the sides of a gate region, respectively. Since the sample is irradiated with a substantially collimated beam in the ion implantation, the n+ regions are formed while the photoresist pattern 10 and the poly-Si layer 11 are functioning as a mask, and no ion is implanted in the side-etched region of the lower layer 12.

The surface of the GaAs substrate 1 is coated with a high polymer such as photoresist 13 to a thickness of about 3 μm, to bury the lower 12 and higher 11 layer therein and to flatten its surface.

Next, the upper part of polymer film 13 is removed by dry etching with O$_2$-plasma or the like to a height at which at least the SiO$_2$ film 12 being the lower layer is exposed (FIG. 2, (c)). The lower layer 12 and the protective film 8 are selectively removed to form a hole 14. In this processing, the dry etching method employing the carrier gas CCl$_2$F$_2$ is used for the SiO$_2$ film 12 being the lower layer, and a dry etching method employing as a carrier gas a gaseous mixture consisting of CF$_4$ and N$_2$ is used for the silicon nitride film 8 being the protective film (FIG. 2, (d)). As the dry etching methods mentioned above, hitherto-known techniques are satisfactorily applied.

At the next step, Ti, Pt and Au are continuously evaporated to respective thicknesses of 50 nm, 50 nm and 200 nm, to deposit a metal layer 15 for forming a Schottky barrier (FIG. 2, (e)). In the figure, the three metal layers are illustrated as a single layer at 15. The construction of this metal layer is commonly known.

When the high polymer layer 13 and the unnecessary part of the metal layer 15 are removed by the lift-off method, a gate electrode 7 is formed (FIG. 2, (f)). Further, the predetermined regions of the protective film 8 are removed, and a source electrode 5 and a drain electrode 6 are formed therein (FIG. 2, (g)). Then, a desired FET is completed.

EMBODIMENT 2

This embodiment will be described with reference to FIG. 3.

Using a photoresist as a mask, Si ions are previously implanted into the required part of a semi-insulating GaAs substrate crystal 1, which is annealed to form an n-type active layer 4. An SiO$_2$ film 12 and a poly-Si film 11 are deposited on the GaAs surface, and they are processed into desired shapes by photolithography. The thickness of each film is several hundred nm. The SiO$_2$ film and the Si film can be selectively etched by choosing the respective reaction gases of the reactive ion etching as stated before. After the patterning, Si ions at a high density are implanted, and the resultant substrate is annealed, thereby to form n+-type ohmic layers (2, 3). Thereafter, only the SiO$_2$ film 12 is side-etched to bring the sectional shape of the pattern into the shape of letter T (FIG. 3, (a)). Since this structure does not deteriorate the crystallinity of the GaAs against a heat treatment at about 900° C., it has the feature that the annealing after the ion implantation can be conducted with the pattern left intact.

Subsequently, the surface of the GaAs crystal 1 is coated with a positive type photoresist (e.g., AZ1350J) to a thickness of 2–3 μm so as to flatten the surface, whereupon the photoresist is developed by irradiating the whole surface with ultraviolet rays. Owing to this treatment, the resist 31 on only the side surface of the side-etched pattern is left behind because it is not irradiated (FIG. 3, (b)). This step can also be executed with a parallel flat plate type asher device. Alloy layers 41 and 42 of AuGe are deposited by evaporation, whereupon the resultant substrate is immersed in a resist removing solution so as to take off the resist remaining on the side-etched side surface. The n+-GaAs regions 2, 3 and the AuGe 41 are brought into ohmic contact by a heat treatment at about 400° C. (FIG. 3, (c)). The resist 31 deposited on the side surface is effective for avoiding step coverage in the operation of depositing the AuGe. Subsequently, a high polymer 16 (e.g., photoresist) is applied so as to cover the surface of the resultant substrate, thereby to flatten the surface. Thereafter, using an asher device, the high polymer is etched until the upper surface of the alloy layer 42 is exposed (FIG. 3, (d)). After the AuGe 42 not to be used has been taken away from the surface using an ion milling device, the Si layer 11 and the SiO$_2$ layer 12 are removed by dry etching so as to provide a hole 14 (FIG. 3, (e)). By the steps thus far described, a reversal pattern having the same dimensions and the same shape as those of the pattern first formed is replicated in the high polymer 16. Subsequently, gate metal (for example, Ti/Pt/Au are continuously evaporated) at numerals 71 and 72 is deposited, whereupon a resist (e.g., AZ1350J) 73 is applied thick once more (FIG. 3, (f)). The resist is uniformly shaved by the use of the asher device until the surface of the gate metal 72 appears in a part of the surface of the sample. Thus, the resist 82 is left on only a gate electrode 81, whereupon the gate electrode not to be used can be removed by the use of the ion milling device (FIG. 3, (g)). When the high polymer resin 16 is taken off, a GaAs-FET having the source electrode 82, drain electrode 83 and gate electrode 81 is finished up (FIG. 3, (h)).

Besides the example stated in the foregoing embodiments, the pattern structure which endures the heat treatment required for forming the n+ ohmic layers can be fabricated by combining at will such materials as $SiO_2$, silicon nitride ($Si_3N_4$), Si, PSG (phosphosilicate glass), W, Ti and Mo. In addition, it is not essential that the sectional structure of the two layers is like as T-shaped, and it is needless to say that three layers having an I-shaped section may well be used by way of example. More specifically, even when the three-layer structure as shown in FIG. 2, which consists of the upper layer and lower layer and also the thin film interposed between the crystal surface and the lower layer, is processed into an I-formed sectional shape, the processing dimensions of the gate metal to be attained by the lift-off are determined by the side-etched width as in the case of the T-shaped section. Therefore, the sectional shape is not restricted.

EMBODIMENT 3

FIG. 4 shows sectional views for explaining another method of manufacturing a semiconductor device according to the present invention.

Using a photoresist pattern as a mask, Si ions are implanted into the required part of a semi-insulating GaAs substrate 1, which is subsequently annealed, thereby to form an n-type active region 4 (FIG. 4, (a)). Next, an silicon nitride protective film 8 being 50 nm thick, an $SiO_2$ film 12 being 800 nm and poly-Si film 11 being 300 nm thick are stacked on the GaAs substrate by well-known methods as shown in FIG. 4, (b). A photoresist pattern 10 is formed on at least that part of the poly-Si film 11 which corresponds to a gate electrode position. Using the photoresist pattern 10 as a mask, the poly-Si film 11 and the $SiO_2$ film 12 are etched. In this case, the poly-Si film 11 is etched by a dry etching method employing as a carrier gas a gaseous mixture which consists of $CF_4$ and oxygen, while the $SiO_2$ film 12 is etched by a dry etching method employing $CCl_2F_2$ as a carrier gas. Thus, the lower layer 12 and the upper layer 11 are so etched that the former has a width smaller than the pattern width of the latter (FIG. 4, (c)).

Subsequently, the GaAs substrate thus prepared is implanted with Si ions at a high density and then annealed at 850° C. so as to form n+ regions (2, 3). The n+ regions 2 and 3 are a source region and a drain region formed on both the sides of a gate region, respectively. Since the sample is irradiated with a substantially collimated beam in the ion implantation, the n+ regions are formed while the photoresist pattern 10 and the poly-Si layer 11 are functioning as a mask, and no ion is implanted in the side-etched region of the lower layer 12.

Thereafter, the photoresist 10 and poly-Si layer 11 which constitute the upper layer are removed (FIG. 4, (d)).

The surface of the GaAs substrate 1 is coated with a high polymer such as photoresist 16 to a thickness of about 3 μm, to bury the lower layer 12 therein and to flatten its surface (FIG. 4, (e)).

Next, the upper part of the high polymer film 16 is removed by dry etching with $O_2$-plasma or the like to a height at which at least the $SiO_2$ film 12 being the lower layer is exposed. The lower layer 12 and the protective film 8 are selectively removed to form a hole 14. In this processing, the dry etching method employing the carrier gas $CCl_2F_2$ is used for the $SiO_2$ film 12 being the lower layer, and a dry etching method employing as a carrier gas a gaseous mixture which consists of $CF_4$ and $N_2$ is used for the silicon nitride film 8 being the protective film (FIG. 4, (f)).

At the next step, Ti, Pt and Au are continuously evaporated to respective thicknesses of 50 nm, 50 nm and 200 nm, to deposit a metal layer 15 for forming a Schottky barrier (FIG. 4, (g)). In the figure, the three metal layers are illustrated as a single layer at 15. The construction of this metal layer is commonly known.

When the high polymer resin layer 16 and the unnecessary part of the metal layer 15 are removed by the lift-off method, a gate electrode 7 is formed (FIG. 4, (h)). Further, the predetermined regions of the protective film 8 are removed, and a source electrode 5 and a drain electrode 6 are formed therein (FIG. 4, (i)). Then, the desired FET is finished up.

In this method of manufacture, the high polymer 16 is applied after the upper layer 11 has been removed. Therefore, the amount of side etching of the lower layer 12 can be precisely measured in the state in which the upper layer 11 has been removed. When the side etching amount of the lower layer 12 is insufficient, it can be brought into a proper value by performing additional etching. Moreover, the application of the high polymer 16 after the removal of the upper layer 11 makes it possible to apply the high polymer resin 16 without any interstice.

Figure 5A:
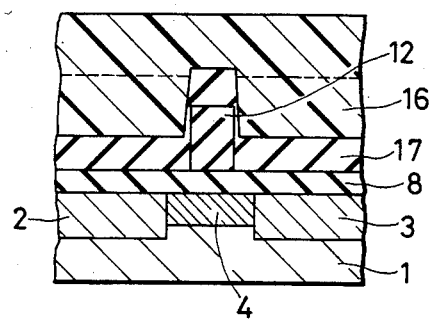
Figure 5B:
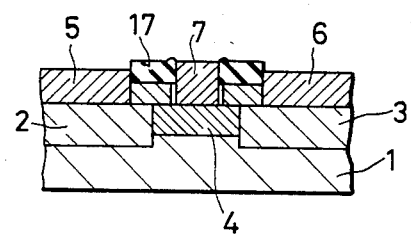
Figure 6A:
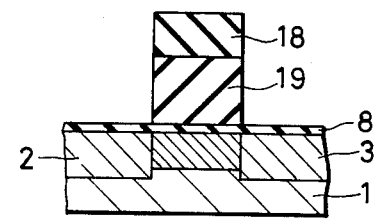
Figure 6B:
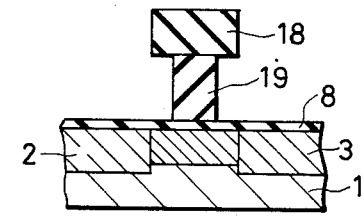
Figure 6C:
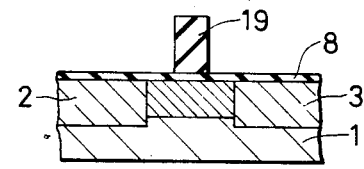
Figure 6D:
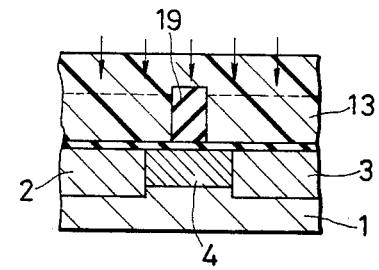

In the above embodiment, the high polymer 16 has been applied immediately after the removal of the upper layer 11. The application of the high polymer 16, however, may well be performed after, as illustrated in FIG. 5, (a), the upper layer 11 is removed and then an silicon nitride film 17 is deposited by, e.g., about 400 nm. In this case, as shown in FIG. 5(b), the ruggedness of the surface of the completed device is relieved, and this structure is suited to the IC implementation. In FIG. 5, the same parts as in FIG. 4 are denoted by the same symbols.

Besides, manufacturing steps after the formation of the high polymer layer 16 are similar to those described before.

FIG. 6 shows views for elucidating another method of manufacturing a semiconductor device according to this invention. In this method of manufacture, Si ions are implanted into the required part of a substrate 1, and the substrate is annealed to form an active region. Thereafter, a protective film 8 made of silicon nitride is deposited, and an $SiO_2$ film 19 being 1 μm thick is stacked and deposited on the resultant body. Subsequently, a photoresist pattern to serve as the upper layer 18 of a pattern is formed, and the $SiO_2$ film is etched using the photoresist pattern, to form the lower layer 19 of the pattern. After such patterning, Si ions at a high density are implanted (FIG. 6, (a)). Thereafter, the lower layer 19 is side-etched (FIG. 6, (b)). Next, the upper layer 18 is removed, and the size of the lower layer 19 is measured. When the lower layer 19 is too large, additional etching is performed to fine the lower layer 19 (FIG. 6, (c)). Next, ion implantation followed by annealing is carried out, and a high polymer 16 is applied to a thickness of about 3 μm so as to relieve the ruggedness of the surface (FIG. 6, (d)). The subsequent steps are similar to those in the case of FIG. 3.

While, in the foregoing embodiments, the methods of manufacturing the GaAs-FETs have been described, this invention is also applicable to methods of manufacturing semiconductor devices in which crystals for ultrahigh frequencies, such as InP, are used as substrates.

While, in the foregoing embodiments, the pattern of the two-layer structure consisting of an upper layer and a lower layer has been basically described, each of the upper layer and lower layer may well be constructed of two or more layers stacked.

As set forth above, with the method of manufacturing a semiconductor device according to this invention, the side etching amount of the lower layer of a pattern can be made an appropriate value, so that a gate electrode can be fined to enhance the performance of the device. Moreover, since a resin can be applied without any interstice, the gate electrode does not become too large in diameter, and the available percentage of the device is sharply improved. In this manner, the invention is remarkably effective.

What is claimed is:

1. A method of manufacturing a semiconductor device comprising the steps of forming a pattern at a gate electrode position on a predetermined semiconductor body, the pattern including at least two regions of an upper layer and a lower layer, the lower layer being made of a non-conductive material, the upper layer being wider than the lower layer; forming first and second impurity regions on both sides of a gate region by ion implantation by employing at least the pattern as a mask; forming a layer of a material on the substrate in a manner to bury at least the lower layer, the material having a selectivity in etching characteristics with respect to a material of the pattern; subsequently removing said pattern, and forming a reversal pattern of at least said lower layer; evaporating a metal layer for a gate electrode, employing said reversal pattern of at least said lower layer as a mask; removing the material layer having the selectivity in etching characteristics with respect to the pattern material; and forming respective electrodes in contact with said first and second impurity regions.

2. A method of manufacturing a semiconductor device according to claim 1, wherein said semiconductor body is made of a semi-insulating semiconductor substrate which is provided with an active region in its upper region.

3. A method of manufacturing a semiconductor device according to claim 1, wherein after forming an insulator layer on said semiconductor body, the pattern having said upper layer and said lower layer is formed at the gate electrode position.

4. A method of manufacturing a semiconductor device according to claim 2, wherein after forming an insulator layer on said semiconductor body, the pattern having said upper layer and said lower layer is formed at the gate electrode position.

5. A method of manufacturing a semiconductor device according to claim 1, wherein the formation of the material layer having the selectivity in etching characteristics with respect to the pattern material is performed after removing said upper layer.

6. A method of manufacturing a semiconductor device according to claim 2, wherein the formation of the material layer having the selectivity in etching characteristics with respect to the pattern material is performed after removing said upper layer.

7. A method of manufacturing a semiconductor device according to claim 3, wherein the formation of the material layer having the selectivity in etching characteristics with respect to the pattern material is performed after removing said upper layer.

8. A method of manufacturing a semiconductor device according to claim 2, wherein the formation of the material layer having the selectivity in etching characteristics with respect to the pattern material is performed after removing said upper layer and further forming a second insulator layer.

9. A method of manufacturing a semiconductor device according to claim 3, wherein the formation of the material layer having the selectivity in etching characteristics with respect to the pattern material is performed after removing said upper layer and further forming a second insulator layer.

10. A method of manufacturing a semiconductor device according to claim 1, wherein said upper layer and said lower layer are inorganic materials having selectivities in etching characteristics therebetween, and the material having the selectivities in etching characteristics with respect to the pattern materials is an organic high polymer resin.

11. A method of manufacturing a semiconductor device according to claim 2, wherein said upper layer and said lower layer are inorganic materials having selectivities in etching characteristics therebetween, and the material having the selectivities in etching characteristics with respect to the pattern materials is an organic high polymer resin.

12. A method of manufacturing a semiconductor device according to claim 3, wherein said upper layer and said lower layer are inorganic materials having selectivities in etching characteristics therebetween, and the material having the selectivities in etching characteristics with respect to the pattern materials is an organic high polymer resin.

13. A method of manufacturing a semiconductor device according to claim 1, wherein after forming said first and second impurity regions, a metal layer is evaporated and is processed into electrodes respectively lying in contact with said first and second impurity regions.

14. A method of manufacturing a semiconductor device according to claim 2, wherein after forming said first and second impurity regions, a metal layer is evaporated and is processed into electrodes respectively lying in contact with said first and second impurity regions.

15. A method of manufacturing a semiconductor device according to claim 1, wherein said respective electrodes are formed in contact with said first and second impurity regions prior to said evaporating a metal layer for a gate electrode.

16. A method of manufacturing a semiconductor device according to claim 15, wherein the formation of the material layer having the selectivity in etching characteristics with respect to the pattern material is performed after removing said upper layer.

17. A method of manufacturing a semiconductor device according to claim 15, wherein said upper layer and said lower layer are inorganic materials having selectivities in etching characteristics therebetween, and the material having the selectivities in etching characteristics with respect to the pattern materials is an organic high polymer resin.

18. A method of manufacturing a semiconductor device according to claim 15, wherein, prior to forming said respective electrodes, each side surface of the lower layer is covered with a resist layer.

19. A method of manufacturing a semiconductor device according to claim 18, wherein each said resist layer is formed to have a thickness such that the resist layers and lower layer extend to a width substantially equivalent to the width of the upper layer.

20. A method of manufacturing a semiconductor device according to claim 15, wherein the step of forming a layer of a material on the substrate in a manner to bury at least the lower layer includes a substep of forming a layer of material on said substrate and said respective electrodes and burying at least said lower layer.

21. A method of manufacturing a semiconductor device, including the steps of:
   forming a pattern at a gate electrode position, on a semiconductor body, the pattern comprising at least two portions, an upper layer and a lower layer, the lower layer being made of a non-conductive material, the upper layer being wider than the lower layer;
   using said pattern as a mask, forming first and second impurity regions respectively on both sides of a gate region;
   burying at least the lower layer in a layer of material having a selectivity in etching characteristics with respect to a material of the pattern;
   removing said lower layer, thereby forming a hole in said layer of material at the gate electrode position; and
   embedding an electrode material in said hole to thereby form a gate electrode at the gate electrode position.

22. A method of manufacturing a semiconductor device according to claim 21, wherein said first and second impurity regions are formed by ion implantation.

23. A method of manufacturing a semiconductor device according to claim 21, wherein said upper layer and said lower layer of said pattern are formed by the steps of:
   (a₁) forming a first layer, of a material for forming said lower layer, on said semiconductor body;
   (a₂) forming a second layer, of a material for forming said upper layer, on said first layer;
   (a₃) selectively removing said second layer to form said upper layer; and
   (a₄) selectively removing said first layer to form said lower layer.

24. A method of manufacturing a semiconductor device according to claim 23, wherein the step of selectively removing said first layer to form said lower layer is performed after the selective removal to form the upper layer but before the step of forming the first and second impurity regions.

25. A method of manufacturing a semiconductor device according to claim 23, wherein the step of selectively removing said first layer to form said lower layer includes a step of removing the first layer, to have a width substantially the same as the upper layer, prior to forming the first and second impurity regions, and then the first layer is side-etched to form said lower layer after forming the first and second impurity regions.

26. A method of manufacturing a semiconductor device according to claim 21, wherein, prior to forming said pattern, a protective film is formed on said semiconductor body, and wherein the portion of said protective film at the gate electrode position is removed prior to forming said gate electrode.

27. A method of manufacturing a semiconductor device according to claim 21, wherein, prior to said burying at least the lower layer in a layer of material, said upper level is removed.

28. A method of manufacturing a semiconductor device according to claim 27, wherein, after removing the upper layer, the lower layer is side-etched in order to provide a lower layer of a desired width.

29. A method of manufacturing a semiconductor device according to claim 1, wherein said lower layer has a width the same as that of the gate electrode, and the upper layer has a width the same as that of the gate region.

30. A method of manufacturing a semiconductor device according to claim 21, wherein said lower layer has a width the same as that of the gate electrode, and the upper layer has a width the same as that of the gate region.

31. A method of manufacturing a semiconductor device according to claim 1, wherein the lower layer is made of materials selected from the group consisting of $SiO_2$, silicon nitride and phosphosilicate glass.

32. A method of manufacturing a semiconductor device according to claim 31, wherein the upper layer is made of materials selected from the group consisting of polycrystalline silicon, $SiO_2$, tungsten, titanium and molybdenum, with the proviso that the materials of the upper and lower layers have selectivities in etching characteristics therebetween.

33. A method of manufacturing a semiconductor device according to claim 21, wherein the lower layer is made of materials selected from the group consisting of $SiO_2$, silicon nitride and phosphosilicate glass.

34. A method of manufacturing a semiconductor device according to claim 1, wherein said layer of a material on the substrate is made of a high polymer.

35. A method of manufacturing a semiconductor device according to claim 1, wherein said layer of a material on the substrate is made of a photoresist material.

36. A method of manufacturing a semiconductor device according to claim 1, wherein said forming first and second impurity regions includes annealing the substrate by a heat treatment, after the ion implantation, in order to form the first and second impurity regions.

* * * * *